(12) United States Patent
Seong et al.

(10) Patent No.: US 9,899,968 B2
(45) Date of Patent: Feb. 20, 2018

(54) LOW NOISE AMPLIFIER CIRCUIT

(71) Applicant: SAMSUNG ELECTRO-MECHANICS CO., LTD., Suwon-si (KR)

(72) Inventors: Nack Gyun Seong, Suwon-si (KR); Sung Hwan Park, Suwon-si (KR); Sang Hoon Ha, Suwon-si (KR); Sang Hee Kim, Suwon-si (KR); Nam Heung Kim, Suwon-si (KR); Sang Wook Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/976,813

(22) Filed: Dec. 21, 2015

(65) Prior Publication Data

US 2016/0268980 A1  Sep. 15, 2016

(30) Foreign Application Priority Data

Mar. 13, 2015 (KR) .......................... 10-2015-0035216

(51) Int. Cl.
| | |
|---|---|
| *H03F 1/56* | (2006.01) |
| *H03G 3/16* | (2006.01) |
| *H03F 1/02* | (2006.01) |
| *H03F 3/193* | (2006.01) |
| *H03F 3/45* | (2006.01) |

(52) U.S. Cl.
CPC ........... *H03F 1/565* (2013.01); *H03F 1/0205* (2013.01); *H03F 3/193* (2013.01); *H03F 3/45188* (2013.01); *H03F 2200/216* (2013.01); *H03F 2200/294* (2013.01)

(58) Field of Classification Search
USPC .......................................... 330/301, 283, 126
See application file for complete search history.

(56) References Cited

U.S. PATENT DOCUMENTS

| | | | |
|---|---|---|---|
| 6,674,337 B2 | 1/2004 | Hashemi et al. | |
| 8,576,005 B2 * | 11/2013 | Liao ........................ | H04B 1/52 330/253 |
| 9,419,569 B2 * | 8/2016 | Jajoo ................... | H03F 3/45179 |
| 2010/0127783 A1 | 5/2010 | Wolf | |

FOREIGN PATENT DOCUMENTS

| | | |
|---|---|---|
| JP | 2009-010826 A | 1/2009 |
| KR | 10-2012-0056233 A | 6/2012 |
| WO | WO 2005/104351 A2 | 11/2005 |

\* cited by examiner

*Primary Examiner* — Hieu Nguyen

(74) *Attorney, Agent, or Firm* — NSIP Law

(57) ABSTRACT

A low noise amplifier circuit includes a first amplifier including a first transistor and a second transistor that are cascode-connected to each other; a second amplifier including a third transistor and a fourth transistor that are cascode-connected to each other; a source terminal matcher connected to a source of the first transistor and a source of the third transistor; and an input matcher providing input that is impedance-matched by a first inductor and a second inductor to a gate of the first transistor and providing input which is impedance-matched by the first inductor to a gate of the third transistor. The circuit is able to operate in a dual-band and provide impedance matching, while being simpler than alternative circuits.

16 Claims, 6 Drawing Sheets

LOW NOISE AMPLIFIER CIRCUIT

CROSS-REFERENCE TO RELATED APPLICATION(S)

This application claims the benefit under 35 USC 119(a) of Korean Patent Application No. 10-2015-0035216 filed on Mar. 13, 2015 in the Korean Intellectual Property Office, the entire disclosure of which is incorporated herein by reference for all purposes.

BACKGROUND

1. Field

The following description relates to a low noise amplifier circuit.

2. Description of Related Art

In accordance with an increased demand for a transmission and reception system that supports a multiband for improving wireless communications speed, the importance of an integrated circuit (IC) design technology that is capable of supporting the multiband and multimode operation in a single IC has increased.

Accordingly, research into a low noise amplifier circuit capable of processing a dual-band signal in a single IC has been actively conducted.

Performance of such an above-mentioned low noise amplifier circuit generally depends on a structure of the amplifier circuit and characteristics of transistors constituting the amplifier circuit, and the low noise amplifier circuit which is generally used has a cascode structure that uses two transistors. For example, a cascode structure may be a two-stage amplifier composed of a transconductance amplifier followed by a current buffer.

Meanwhile, since a dual-band low noise amplifier circuit for processing the dual-band signal includes impedance matching elements for the low noise amplifier circuit to amplify each band, the impedance matching elements act as an issue when miniaturizing the low noise amplifier circuit.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An aspect of the present examples provides a low noise amplifier circuit that is selectively operated in a dual-band by a switching control.

In one general aspect, a low noise amplifier circuit includes a first amplifier including a first transistor and a second transistor that are cascode-connected to each other, a second amplifier including a third transistor and a fourth transistor that are cascode-connected to each other, a source terminal matcher connected to a source of the first transistor and a source of the third transistor, and an input matcher providing input that is impedance-matched by a first inductor and a second inductor into a gate of the first transistor and providing input that is impedance-matched by the first inductor into a gate of the third transistor.

The first transistor and the third transistor may be n-channel metal oxide semiconductor (NMOS) field effect transistors having different input impedances.

The source terminal matcher may include a third inductor including one terminal that is connected to the source of the first transistor and the source of the third transistor and another terminal that is connected to a ground.

The gate of the first transistor may be connected to a first gate voltage supply terminal, and the gate of the third transistor may be connected to a second gate voltage supply terminal.

A gate of the second transistor and a gate of the fourth transistor may be connected to a driving power source.

In response to driving power and a first gate voltage being applied to the first amplifier, the first amplifier may output a first output signal obtained by amplifying a first band signal, and in response to the driving power and a second gate voltage being applied to the second amplifier, the second amplifier may output a second output signal obtained by amplifying a second band signal.

In another general aspect, a low noise amplifier circuit includes an input matcher configured to perform impedance matching with respect to each of first and second band signals that are input through an input terminal, a first amplifier configured to amplify the first band signal through the input matcher, a second amplifier configured to amplify the second band signal through the input matcher, and a source terminal matcher having an impedance element for input impedance matching that is connected between a common node connected to the first amplifier and the second amplifier and a ground.

In response to driving power and a first gate voltage being applied to the first amplifier, the first amplifier may output a first output signal obtained by amplifying the first band signal, and in response to the driving power and a second gate voltage being applied to the second amplifier, the second amplifier may output a second output signal obtained by amplifying the second band signal.

The input matcher may perform impedance matching with respect to the first band signal using a first inductor and a second inductor, and may perform impedance matching with respect to the second band signal using the first inductor.

The first amplifier may include a first transistor and a second transistor that are cascode-connected to each other, and the second amplifier may include a third transistor and a fourth transistor that are cascode-connected to each other.

The first transistor and the third transistor may be n-channel metal oxide semiconductor (NMOS) field effect transistors having different input impedances.

The source terminal matcher may include a third inductor having one terminal that is connected to a source of the first transistor and a source of the third transistor and another terminal that is connected to the ground.

A gate of the first transistor may be connected to a first gate voltage supply terminal, and a gate of the third transistor may be connected to a second gate voltage supply terminal.

A gate of the second transistor and a gate of the fourth transistor may be connected to a driving power source.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, examples of the present disclosure are described in further detail with reference to the accompanying drawings.

Figure 1:
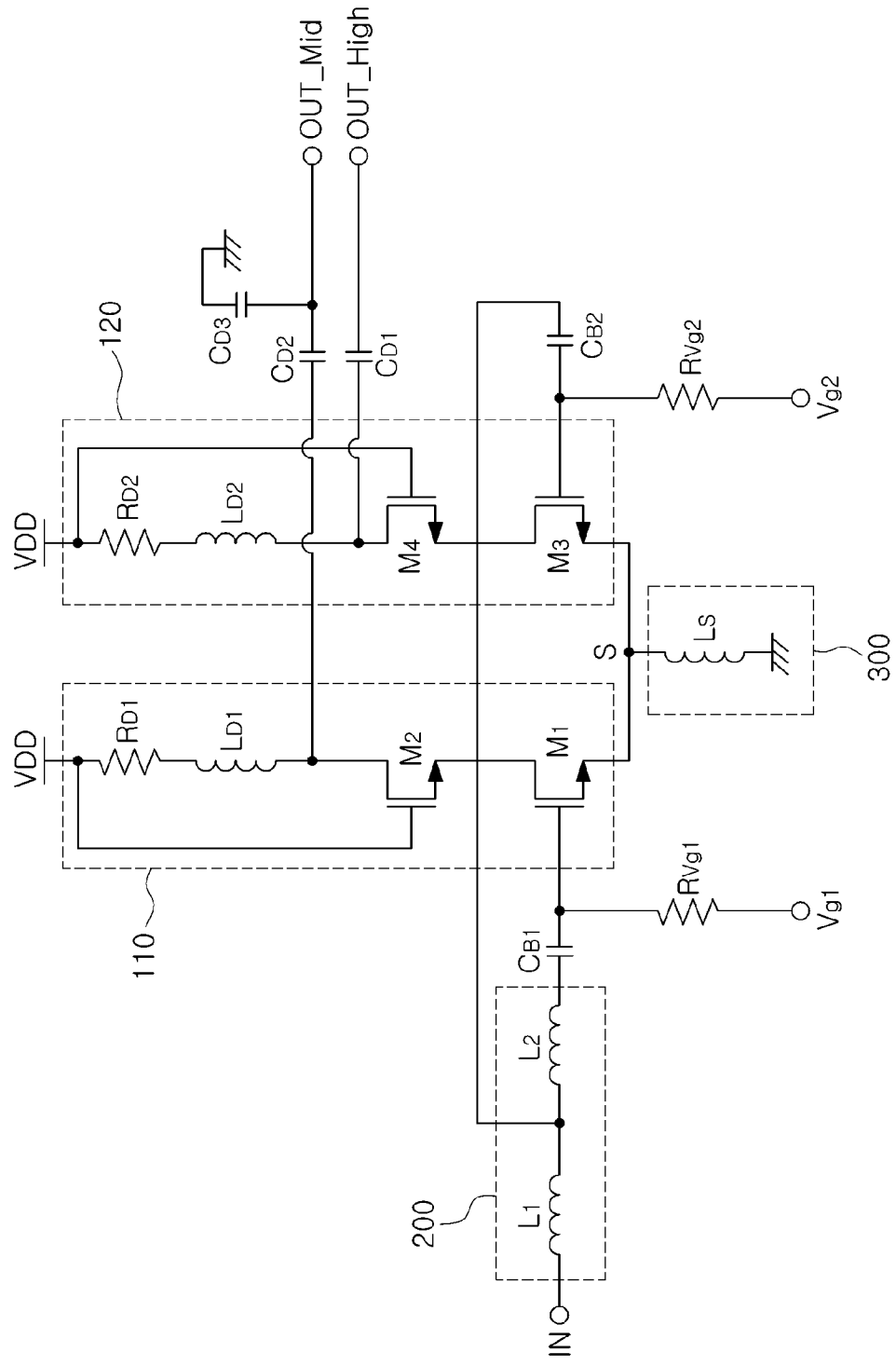
FIG. 1 is a circuit diagram illustrating a low noise amplifier circuit according to an example.

FIG. 1 is a circuit diagram illustrating a low noise amplifier circuit according to an example.

Referring to the example of FIG. 1, a low noise amplifier circuit, according to an example, includes a first amplifying unit 110, a second amplifying unit 120, an input matching unit 200, and a source terminal matching unit 300.

In addition, the first amplifying unit 110 includes a first transistor and a second transistor that are cascode-connected to each other, and the second amplifying unit 120 includes a third transistor and a fourth transistor that are cascode-connected to each other.

FIG. 1 illustrates the first to fourth transistors M1 to M4 as n-channel metal oxide semiconductor (MOS) field-effect transistors.

For example, the first amplifying unit 110 amplifies a first band signal through the input matching unit 200.

To this end, in this example, the first amplifying unit 110 has a structure in which the first transistor M1 and the second transistor M2 are cascode-connected between a driving power source VDD and the source terminal matching unit 300.

As a more specific example, the second transistor M2 has a gate that is connected to the driving power source VDD, a drain that is connected to a node branched into a first output terminal OUT_Mid, and a source that is connected to a drain of the first transistor M1.

In addition, in this example, load elements $R_{D1}$ and $L_{D1}$ are located between the drain of the second transistor M2 and the driving power source VDD.

The first transistor M1 has a gate that receives the first band signal provided by the input matching unit 200 and a source connected to the source terminal matching unit 300.

The second amplifying unit 120 amplifies a second band signal through the input matching unit 200.

To this end, the second amplifying unit 120 has a structure in which the third transistor M3 and the fourth transistor M4 are cascode-connected between the driving power source VDD and the source terminal matching unit 300.

More specifically, the fourth transistor M4 has a gate connected to the driving power source VDD, a drain connected to a node branched into a second output terminal OUT_High, and a source connected to the drain of the third transistor M3.

In addition, load elements $R_{D2}$ and $L_{D2}$ are located between the drain of the fourth transistor M4 and the driving power source VDD.

The third transistor M3 has a gate that receives the second band signal provided by the input matching unit 200 and a source connected to the source terminal matching unit 300.

In addition, when a driving power and a first gate voltage Vg1 are applied to the first amplifying unit 110, the first amplifying unit 110 outputs a first output signal, obtained by amplifying the first band signal, to the first output terminal as OUT_Mid, and when the driving power and a second gate voltage Vg2 are applied to the second amplifying unit 120, the second amplifying unit 120 outputs a second output signal, obtained by amplifying the second band signal, to the second output terminal as OUT_High.

To this end, a supply terminal of the first gate voltage Vg1 is connected to the gate of the first transistor M1 that is included in the first amplifying unit 110, and a supply terminal of the second gate voltage Vg2 is connected to the gate of the third transistor M3 that is included in the second amplifying unit 120.

Thus, the first amplifying unit 110 and the second amplifying unit 120, according to an example, amplify signals in a dual-band according to a switching control, based on a manner in which the first gate voltage Vg1 and the second gate voltage Vg2 are selectively applied.

The input matching unit 200 performs impedance matching with respect to each of the first and second band signals, which are input through an input terminal IN.

In order to perform input impedance matching in the dual-band, the input matching unit 200 includes a first inductor L1 and a second inductor L2.

More specifically, the input matching unit 200 provides input that is impedance-matched by the first inductor L1 and the second inductor L2 to the gate of the first transistor M1, and provides input which is impedance-matched by the first inductor L1 alone to the gate of the third transistor M3.

As an example, when a band of the first band signal is 1880 MHz to 2200 MHz and a band of the second band signal is 2300 MHz to 2700 MHz, the input matching unit 200 performs impedance matching with respect to a signal of 1880 MHz to 2200 MHz by the first inductor L1 and the second inductor L2 and performs impedance matching with respect to a signal of 2300 MHz to 2700 MHz by the first inductor L1 alone.

Thus, because the number of inductors for impedance matching is significantly reduced, the low noise amplifier circuit is potentially miniaturized and is also potentially decreased in complexity and cost.

For example, the source terminal matching unit 300 has an impedance element for input impedance matching that is connected between a common node S that is connected between the first amplifying unit 110 and the second amplifying unit 120 and a ground.

That is, in this example, the source terminal matching unit 300 includes a third inductor $L_S$ having one terminal that is connected to the source of the first transistor M1 and the source of the third transistor M3 and another terminal that is connected to the ground.

The source of the first transistor M1 and the source of the third transistor M3 are connected to one terminal of the third inductor $L_S$ through the common node S.

In addition, input impedance of each of the gate of the first transistor M1 and the gate of the third transistor M3 is optimized by adopting the first transistor M1 and the third transistor M3 to have different characteristics.

Further description of such different characteristics is provided below with reference to FIG. 6.

Figure 2:
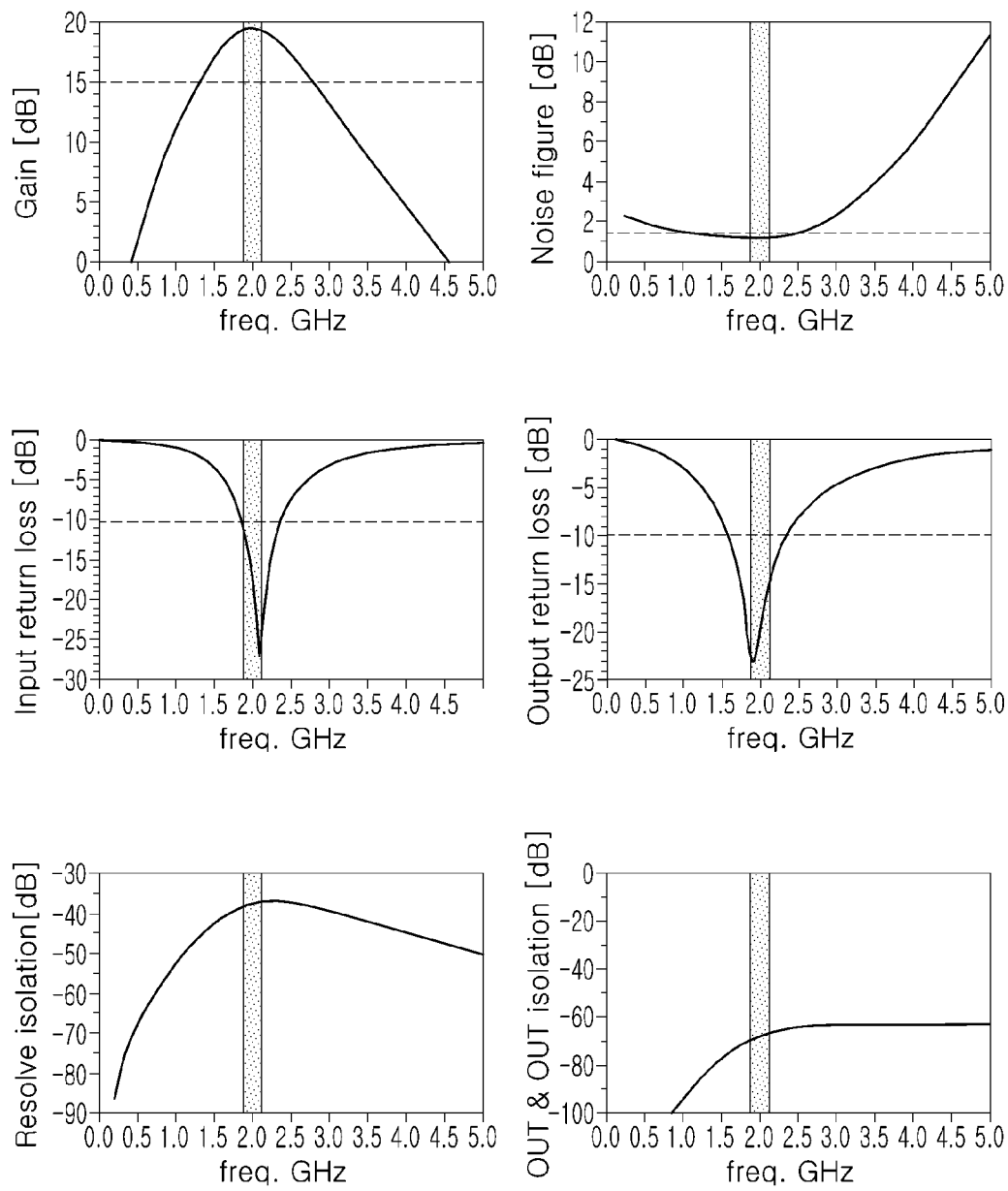
FIG. 2 shows graphs illustrating S-parameter simulation results of a low noise amplifier circuit in a band of 1880 to 2200 MHz, according to an example.

FIG. 2 shows graphs illustrating S-parameter simulation results of a low noise amplifier circuit in a band of 1880 to 2200 MHz, according to an example.

In the above-mentioned simulation of FIG. 2, a voltage of the driving power source VDD in the example of FIG. 1 was 1.6V, the first gate voltage Vg1 in the example of FIG. 1 was 0.45V, and an amount of current consumed was 10.5 mA.

Referring to FIG. 2, it is observable that a voltage gain in the band of 1880 MHz to 2200 MHz was about 19 dB, and a noise figure in the band of 1880 MHz to 2200 MHz was 1.15 dB or less.

In addition, it is observable from FIG. 2 that input return loss and output return loss were −10 dB or less.

In addition, it is observable that reverse isolation indicating isolation performance of a returned signal was −35 dB or less, and out to out isolation was −60 dB or less.

Figure 3:
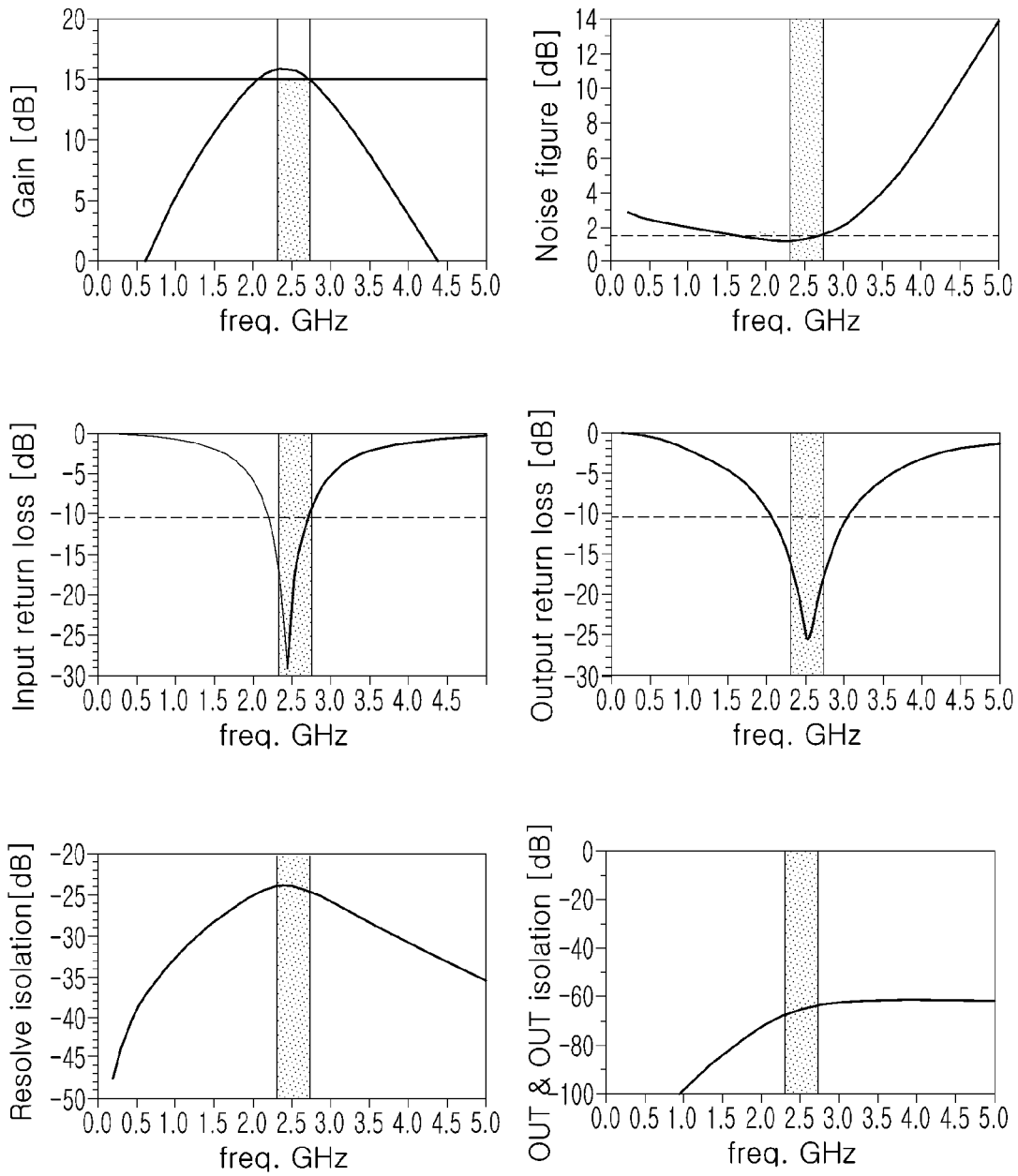
FIG. 3 shows graphs illustrating S-parameter simulation results of a low noise amplifier circuit in a band of 2300 to 2700 MHz, according to an example.

FIG. 3 shows graphs illustrating S-parameter simulation results of a low noise amplifier circuit in a band of 2300 to 2700 MHz, according to an example.

In the above-mentioned simulation, a voltage of the driving power source VDD in the example of FIG. 1 was 1.6V, the second gate voltage Vg2 in the example of FIG. 1 was 0.45V, and an amount of current consumed was 8 mA.

Referring to FIG. 3, it is observable that a voltage gain in the band of 2300 MHz to 2700 MHz was about 19 dB, and a noise figure in the band of 2300 MHz to 2700 MHz was 1.5 dB or less.

In addition, it is observable that input return loss and output return loss were −10 dB or less.

In addition, it is observable that reverse isolation indicating isolation performance of a returned signal was −20 dB or less, and out to out isolation was −60 dB or less.

Figure 4:
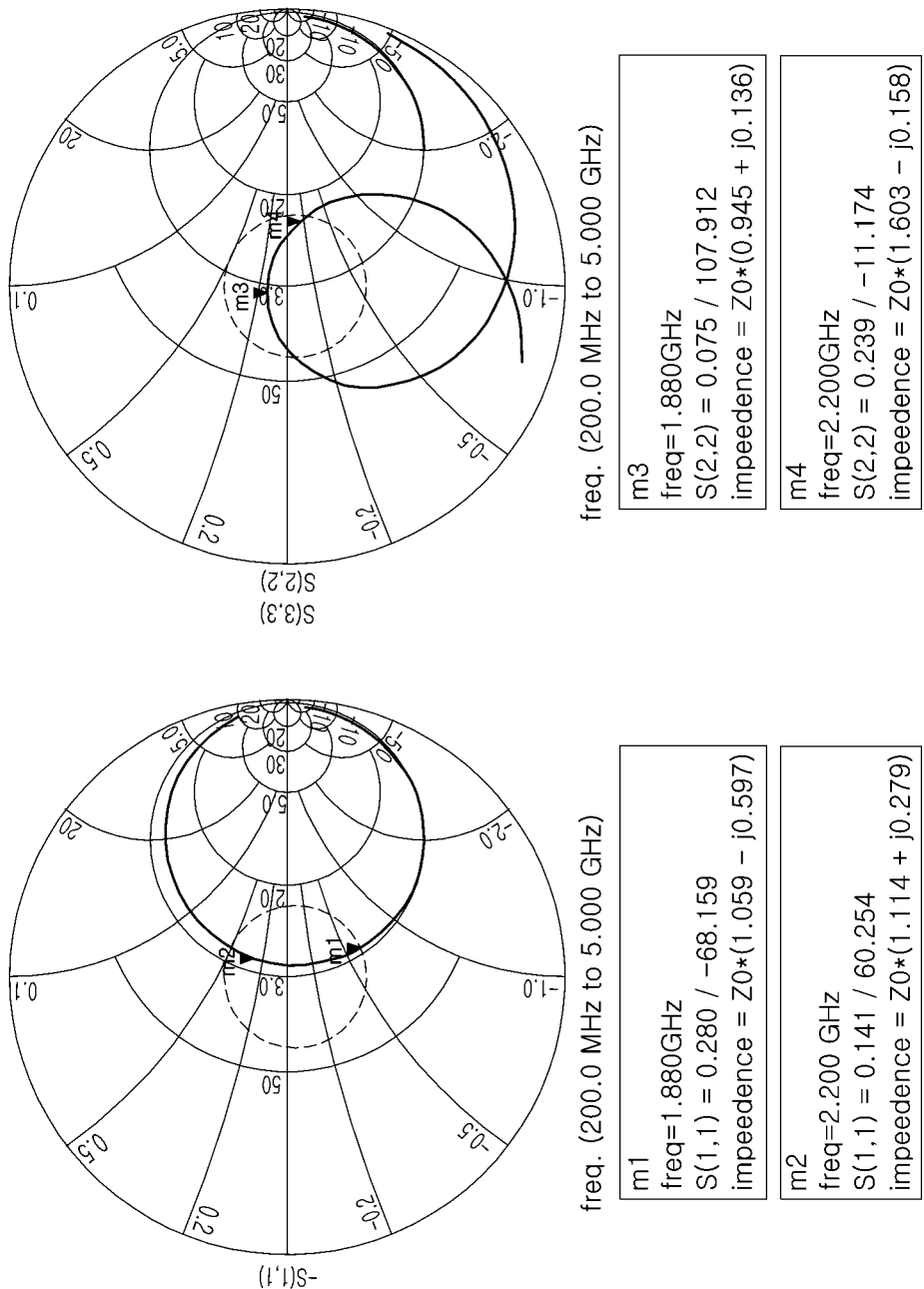
FIG. 4 shows graphs illustrating impedance characteristics of a low noise amplifier circuit in a band of 1880 MHz to 2200 MHz, according to an example.

FIG. 4 shows graphs illustrating impedance characteristics of a low noise amplifier circuit in a band of 1880 MHz to 2200 MHz, according to an example.

Referring to m1 and m2 of FIG. 4, it is observable that input impedances at respective frequencies of 1880 MHz and 2200 MHz were included in a normal input impedance range on the basis of 1+j0, which is a center point obtained by normalizing characteristics impedance of 50Ω.

In addition, referring to m3 and m4 of FIG. 4, it is observable that output impedances at respective frequencies of 1880 MHz and 2200 MHz were included in a normal output impedance range.

Figure 5:
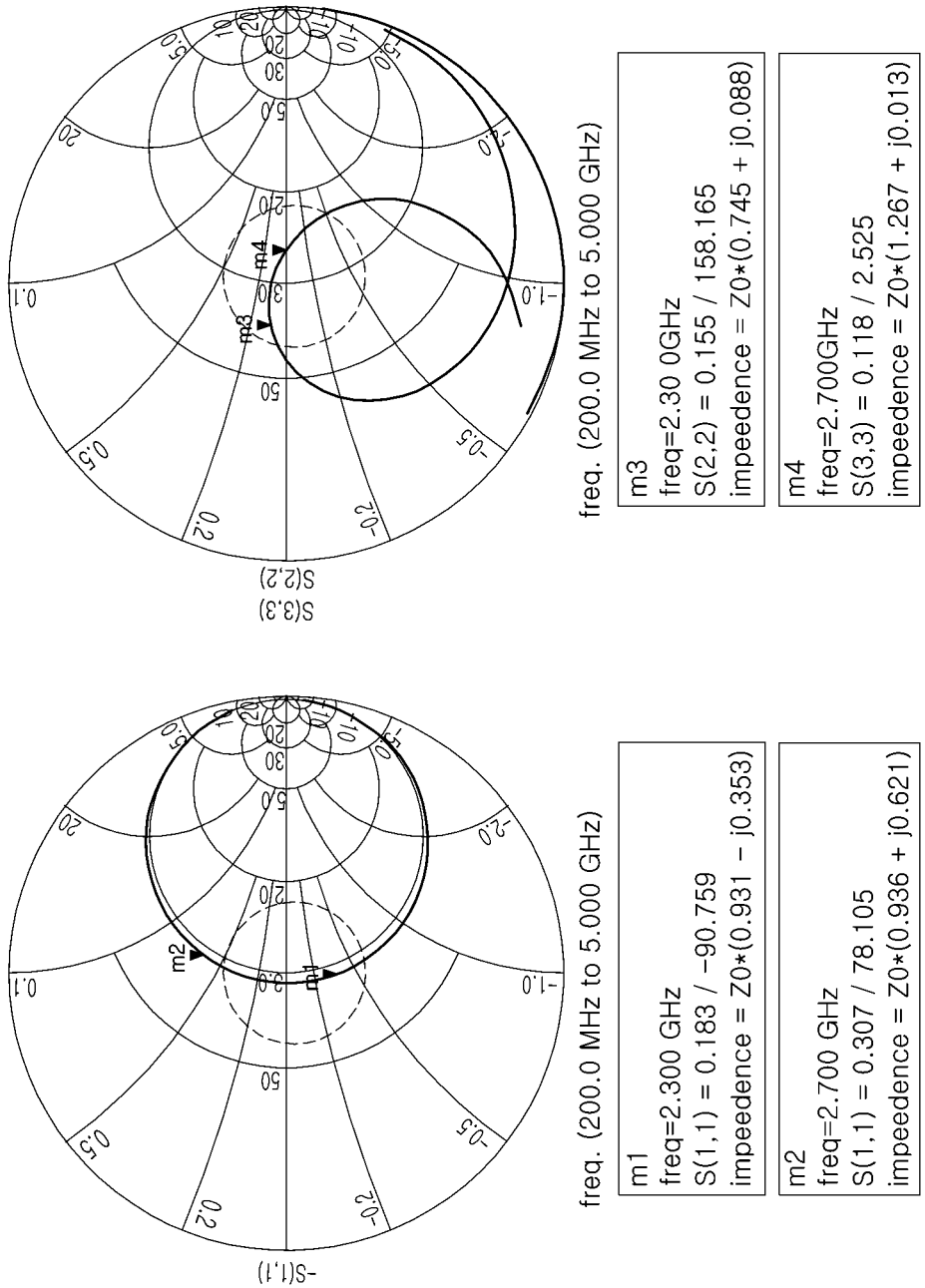
FIG. 5 shows graphs illustrating impedance characteristics of a low noise amplifier circuit in a band of 2300 MHz to 2700 MHz, according to an example.

FIG. 5 shows graphs illustrating impedance characteristics of a low noise amplifier circuit in a band of 2300 MHz to 2700 MHz, according to an example.

Referring to m1 and m2 of FIG. 5, it is observable that input impedances at respective frequencies of 2300 MHz and 2700 MHz were included in a normal input impedance range.

In addition, referring to m3 and m4 of FIG. 5, it is observable that output impedances at respective frequencies of 2300 MHz and 2700 MHz were included in a normal output impedance range.

Referring to FIGS. 2 through 5, it is observable that the low noise amplifier circuit, according to the example, satisfies a normal level of 2:1 of a voltage standing wave ratio (VSWR) in a dual-band of operation, including 1880 MHz to 2200 MHz and 2300 MHz to 2700 MHz.

Figure 6:
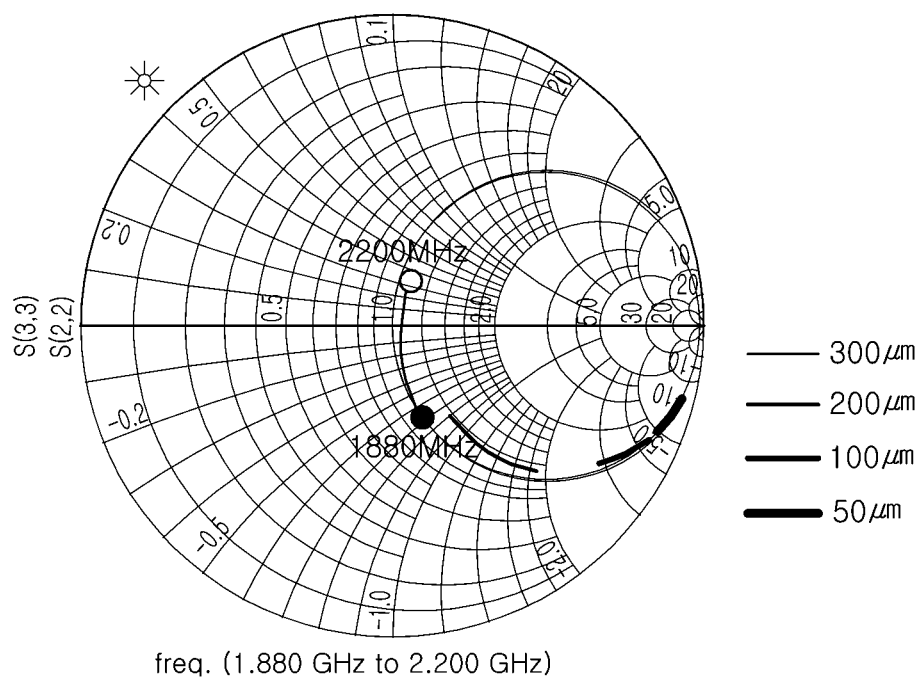
FIG. 6 shows a graph illustrating input impedance characteristics associated with transistor characteristics of a low noise amplifier circuit, according to an example.

FIG. 6 shows a graph illustrating input impedance characteristics associated with transistor characteristics of a low noise amplifier circuit, according to an example.

Referring to the example of FIG. 1, the source of the first transistor M1 and the source of the third transistor M3 are connected to the third inductor $L_S$ through the common node S.

For example, input impedance of a gate of the first transistor M1 is expressed by the following Equation 1:

$$Z_{in} \approx j\omega(L_g + L_s) + \frac{1}{j\omega C_{gsM1}} + \frac{g_{mM1} L_s}{C_{gsM1}} \qquad \text{Equation 1}$$

Here, CgsM1 is a parasitic capacitance between the gate and the source of the first transistor M1, and gmM1 is a transmission conductance of the first transistor M1.

Referring to FIG. 6, it is observable that the ranges of input impedance in the band of 1880 MHz to 2200 MHz differ depending on a gate channel width of the first transistor M1.

In the graph of FIG. 6, the gate channel width of the first transistor M1 having a normal input impedance range in the band of 1880 MHz to 2200 MHz is, for example, 300 μm.

That is, in examples, the input impedance of the gate of the first transistor M1 is adjusted depending on characteristics of the first transistor M1.

In addition, input impedance of the gate of the third transistor M3 is adjusted depending on characteristics of the third transistor M3.

Therefore, the source of the first transistor M1 and the source of the third transistor M3 are connected to the same third inductor $L_S$, but the first transistor M1 and the third transistor M3 having different characteristics are adopted, and as a result, the input impedance is optimized.

As set forth above, according to examples, a low noise amplifier circuit is operated in a dual-band by a switching control and may significantly reduce the number of elements for impedance matching, whereby the low noise amplifier circuit may be miniaturized.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation, Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A low noise amplifier circuit comprising:
   a first amplifier comprising a first transistor and a second transistor that are cascode-connected to each other;
   a second amplifier comprising a third transistor and a fourth transistor that are cascode-connected to each other;
   a source terminal matcher directly connected to a source of the first transistor and a source of the third transistor; and
   an input matcher configured to provide input that is impedance-matched by a first inductor and a second inductor into a gate of the first transistor and to provide input that is impedance-matched by the first inductor into a gate of the third transistor,
   wherein input impedance into the gate of the first transistor is different from input impedance into the gate of the third transistor.

2. The low noise amplifier circuit of claim 1, wherein the first transistor and the third transistor are n-channel metal oxide semiconductor (NMOS) field effect transistors having different input impedances.

3. The low noise amplifier circuit of claim 1, wherein the source terminal matcher comprises a third inductor comprising one terminal that is directly connected to the source of the first transistor and the source of the third transistor, and another terminal that is connected to a ground.

4. The low noise amplifier circuit of claim 1, wherein the gate of the first transistor is connected to a first gate voltage supply terminal, and
   the gate of the third transistor is connected to a second gate voltage supply terminal.

5. The low noise amplifier circuit of claim 1, wherein a gate of the second transistor and a gate of the fourth transistor are connected to a driving power source.

6. The low noise amplifier circuit of claim 1, wherein, the first amplifier is configured to, in response to driving power and a first gate voltage being applied to the first amplifier, output a first output signal obtained by amplifying a first band signal, and
   the second amplifier is configured to, in response to the driving power and a second gate voltage being applied to the second amplifier, output a second output signal obtained by amplifying a second band signal.

7. The low noise amplifier circuit of claim 1, wherein a measure of input impedance provided by the first inductor and the second inductor into the gate of the first transistor is different in magnitude from a measure of input impedance provided by the first inductor into the gate of the third transistor.

8. A low noise amplifier circuit comprising:
   an input matcher configured to perform impedance matching with respect to each of first and second band signals that are input through an input terminal;
   a first amplifier configured to amplify the first band signal through the input matcher;
   a second amplifier configured to amplify the second band signal through the input matcher; and
   a source terminal matcher having an impedance element for input impedance matching that is directly connected to a common node and a ground,
   wherein the common node is directly connected to the first amplifier and the second amplifier, and
   wherein the first band signal comprises a different frequency band than the second band signal.

9. The low noise amplifier circuit of claim 8, wherein the first amplifier is configured to, in response to driving power and a first gate voltage being applied to the first amplifier, output a first output signal obtained by amplifying the first band signal, and
   the second amplifier is configured to, in response to the driving power and a second gate voltage being applied to the second amplifier, output a second output signal obtained by amplifying the second band signal.

10. The low noise amplifier circuit of claim 8, wherein the input matcher is further configured to perform impedance matching with respect to the first band signal using a first inductor and a second inductor, and to perform impedance matching with respect to the second band signal using the first inductor.

11. The low noise amplifier circuit of claim 8, wherein the first amplifier comprises a first transistor and a second transistor that are cascode-connected to each other, and
   the second amplifier comprises a third transistor and a fourth transistor that are cascode-connected to each other.

12. The low noise amplifier circuit of claim 11, wherein the first transistor and the third transistor are n-channel metal oxide semiconductor (NMOS) field effect transistors having different input impedances.

13. The low noise amplifier circuit of claim 11, wherein the source terminal matcher comprises a third inductor having one terminal that is directly connected to a source of the first transistor and a source of the third transistor and, another terminal that is connected to the ground.

14. The low noise amplifier circuit of claim 11, wherein a gate of the first transistor is connected to a first gate voltage supply terminal, and
   a gate of the third transistor is connected to a second gate voltage supply terminal.

15. The low noise amplifier circuit of claim 11, wherein a gate of the second transistor and a gate of the fourth transistor are connected to a driving power source.

16. The low noise amplifier circuit of claim 8, wherein the input matcher is further configured to provide a first matching impedance at the gate of the first transistor, and a second matching impedance different from the first matching impedance at the gate of the third transistor.

\* \* \* \* \*